United States Patent [19]
Chang

[11] Patent Number: 5,379,254
[45] Date of Patent: Jan. 3, 1995

[54] ASYMMETRICAL ALTERNATE METAL VIRTUAL GROUND EPROM ARRAY

[75] Inventor: Ming-Bing Chang, Santa Clara, Calif.

[73] Assignee: National Semiconductor Corporation, Santa Clara, Calif.

[21] Appl. No.: 963,985

[22] Filed: Oct. 20, 1992

[51] Int. Cl.⁶ .............................................. G11C 5/06
[52] U.S. Cl. .................................. 365/185; 365/182; 365/189.01; 365/900; 365/222; 257/314; 257/315
[58] Field of Search ............... 365/185, 182, 189.01, 365/900, 222; 257/314, 315, 390, 391, 392

[56] References Cited

U.S. PATENT DOCUMENTS 5,024,835  4/1993  Eitan .................................. 365/185
5,212,541  5/1993  Bergemont ......................... 365/185

Primary Examiner—Eugene R. LaRoche
Assistant Examiner—Huan Hoang
Attorney, Agent, or Firm—Limbach & Limbach; Stephen R. Robinson

[57] ABSTRACT

An asymmetrical alternate metal virtual ground (AAMG) EPROM array utilizing an asymmetrical stacked gate cell with an N⁻ source and four additional select lines is provided. The unintentional write problem associated with the conventional AMG EPROM array is eliminated by utilizing a high select transistor bias voltage and the asymmetrical cell. Soft write of the selected cell is minimized by biasing the source terminal during a read operation. Thus, bit line bias can be significantly increased to enhance the cell current and the memory performance without effecting data retention.

4 Claims, 6 Drawing Sheets

| Bias Operation | Bit Lines | | | Select | | Word Lines | |
|---|---|---|---|---|---|---|---|
| | m | m−1 | Others | Sel | Sel | i+63 | Others |
| Write cell B | 7V | 0V | float | 0V | 12V | 12V | 0V |
| Read cell B | 2V | 0V | 2V | 0V | 5V | 5V | 0V |

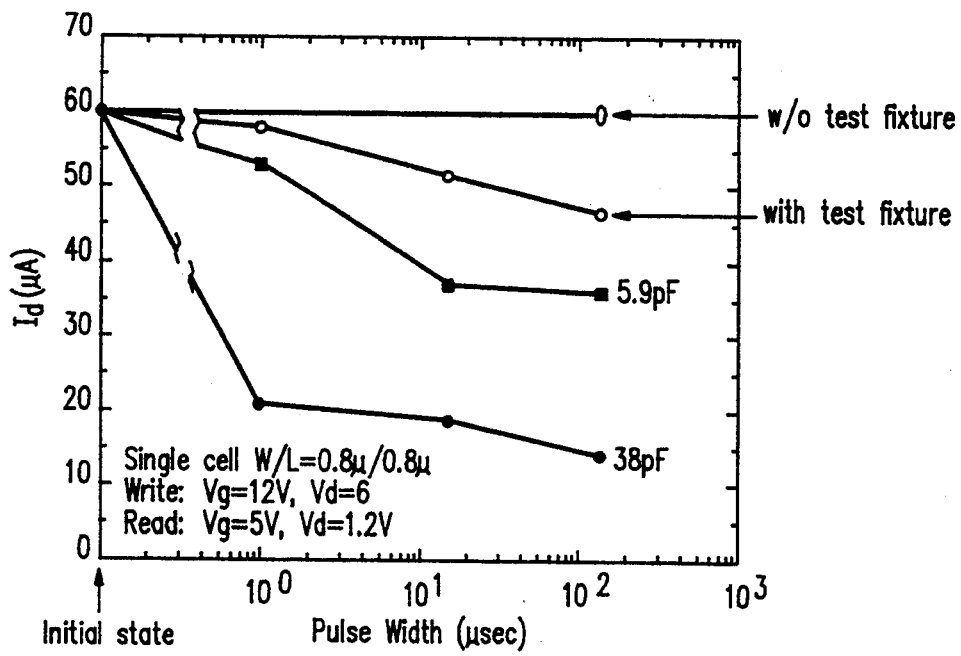
PRIOR ART
FIG. 4B
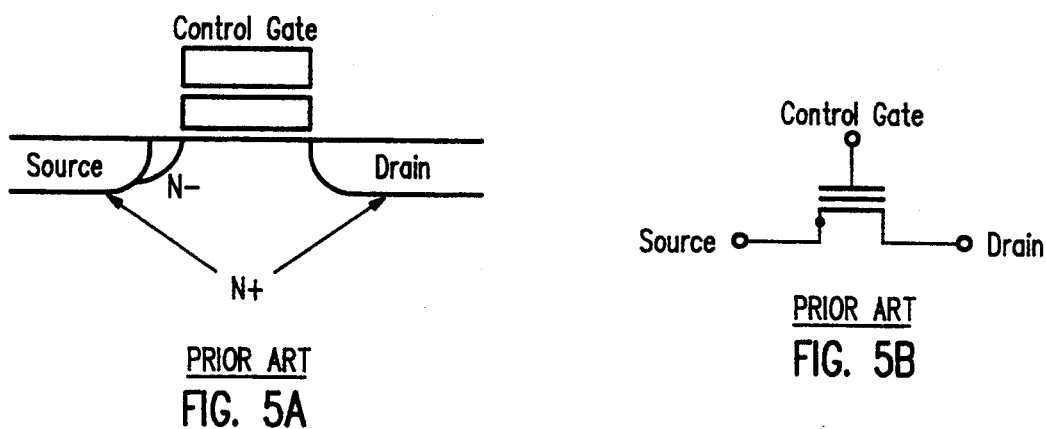
PRIOR ART
FIG. 5A
PRIOR ART
FIG. 5B

| Bias Operation | Bit Lines | | | Select Lines | | | | Word Lines | |
|---|---|---|---|---|---|---|---|---|---|
| | m | m−1 | Others | i+0 | i+1 | i+2 | i+3 | i+63 | Others |
| Write cell B | 7V | 0V | float | 0V | 12V | 0V | 12V | 12V | 0V |
| Read cell B | 0V | 2V | 2V | 5V | 0V | 0V | 5V | 5V | 0V |

ASYMMETRICAL ALTERNATE METAL VIRTUAL GROUND EPROM ARRAY

BACKGROUND OF THE INVENTION

1. Field of the Invention

The present invention relates to electrically programmable read only memory (EPROM) devices and, in particular, to an alternate metal virtual ground (AMG) EPROM array that is based on an asymmetrical cell architecture.

2. Discussion of the Prior Art

U.S. patent application Ser. No. 539,657, filed by Boaz Eitan on Jun. 13, 1990 for EPROM VIRTUAL GROUND ARRAY, discloses an AMG EPROM cell array and its associated process flow. The Eitan AMG array is attractive because it allows high density EPROMs to be fabricated without using aggressive fabrication techniques and design rules.

The basic idea of the Eitan array is the use of a "crosspoint" EPROM cell, i.e. a cell which is defined by the perpendicular crossing of a polysilicon (poly 1) floating gate and a polysilicon (poly 2) word line in a virtual ground array. In order to avoid drain turn-on, i.e. electron leakage from unselected cells on the same bit line as the selected cell, metal contacts silicon only on alternate bit lines and the non-contacted source bit lines are connected to ground potential only via access select transistors, as shown in the FIG. 1 layout.

Additionally, in the Eitan array, each drain bit line is contacted only once every 64 cells, each group of 64 cells on the same drain bit line constituting one segment. Typically, 16 segments are combined to define a block of cells in the array in that is 16 bits wide. Thus, when programming a particular cell, only one 64-cell segment need be addressed. All other segments are "off". Therefore, the cells in these unselected segments are not susceptible to leakage.

By strapping alternate bit lines and by utilizing select transistors, the Eitan array transfers the scaling limitation of the array from the metal pitch to the polysilicon pitch. As a result, an EPROM cell size of 2.56 $\mu m^2$ with 0.8 $\mu m$ layout rules can be realized for 4 Mbit memory applications and beyond. Furthermore, by introducing select transistors, drain turn-on induced punch through can be minimized and the effective channel length of the cell can be reduced to as low as 0.25 $\mu m$, thereby increasing cell read current and enhancing programmability.

However, due to the symmetry of the stacked gate cell utilized in the Eitan AMG array, a neighboring unselected cell can be unintentionally written during a write operation. Furthermore, soft write of the selected cell during read operations limits bit line bias and memory performance.

More specifically, as shown in FIGS. 2A and 2B, to read cell B in the conventional AMG array, word line WL(i+63) and select lines Sel are biased at 5 V while select lines Sel are grounded; bit line m−1 is grounded, while the other bit lines are biased at a bit line voltage $V_{BL}$ with the sense amplifier (not shown) attached to bit line m. With this bias scheme, the potential soft write of cell B limits the bit line bias voltage $V_{BL}$ and, thus, cell current and memory performance.

FIG. 3 shows the soft write characteristics of the conventional AMG EPROM cell with a W/L of 0.8$\mu$/0.8$\mu$. According to the FIG. 3 data, in order no guarantee 10 year data retention, the bit line voltage $V_{BL}$ must be less than 1.47 V. Due to the low coupling ratio (0.4~0.45) and the low bit line voltage $V_{BL}$, single cell read current (Vg=5 V and Vd=1.2 V) is less than 60 $\mu$A. For a multi-Mbit EPROM array, low cell read current combined with high bit line capacitance results in slow memory access.

As stated above, in addition to low cell current, unintentional write of a neighboring unselected cell during a write operation poses a data retention problem for the conventional AMG array.

Referring again to FIGS. 2A and 2B, to write cell B, word line WL(i+63) and select lines Sel are biased at 12 V while select lines Sel are grounded. Bit lines m and m−1 are biased at 7 V and 0 V, respectively, while unselected bit lines are left to float. With this bias scheme, cell D can be unintentionally written because of the high bit line bias at the drain and high bit line capacitance attached to the source.

With 0.80 $\mu m$ layout rules, a conservative estimate gives a bit line capacitance of 5.7 pF for a 16 Mbit array. When the conventional AMG EPROM array is laid out in blocks of 16 bits wide, the worst case total bit line capacitance attached to the source of cell D can be as high as 40 pF since a 12 V word line bias effectively shorts 7 bit lines to the source of cell D.

FIGS. 4A and 4B show the unintentional write characteristics of the conventional AMG cell with various capacitors attached to the source. As shown in FIG. 4A, when a 38 pF capacitor is attached to the source, unintentional write can cause an erased cell threshold voltage $V_{th}$ to increase from 1.6 V to nearly 4 V, while, as shown in FIG. 4B, cell current drops from 60 $\mu$A to less than 15 $\mu$A. Thus, data loss can occur.

The unintentional write problem discussed above can be minimized by reducing the bias on the select lines Sel of the array to increase the voltage drop across the select transistor. However, under these bias conditions, the bit line charging current is now distributed between two select transistors and cell C, which can now be unintentionally written. Furthermore, a low bias voltage on select lines Sel results in a high source potential for the selected cell (cell B in FIG. 2) because both the write current of the selected cell and the punch-through current of the 63 unselected cells must be supplied through two select transistors. The high source potential results in a low voltage drop across the channel and a high cell threshold voltage (body effect) which can significantly degrade cell programmability.

To insure that cells with the highest series resistance, i.e. cells along word lines WL(i+31) and WL(i+32), and under the worst-case processing conditions, can be properly written within 10 $\mu$sec., a bit line bias greater than 7 V is needed. Unfortunately, high bit line bias exacerbates both the unintentional write problem for cell C and the punch-through problem for the 63 unselected cells.

Thus, without significant modification, the operating margin of a 16 Mbit EPROM array based on the conventional AMG architecture is limited.

Yoshikawa et al, "An Asymmetrical Lightly Doped Source (ALDS) Cell for Virtual Ground High Density EPROMs", IEDM, p. 432, 1988, disclose an EPROM cell structure that utilizes a lightly doped source region. As shown in FIG. 5A, an N− implant and an N+ pullback implant at the source creates an asymmetrical cell that is suitable for use in a high density virtual ground EPROM array because the problem of unintentional write during a write operation is eliminated. FIG. 5B shows a drawing convention that will be used in the discussion below wherein a black dot is used to depict the N⁻ source and the asymmetrical nature of the call.

SUMMARY OF THE INVENTION

The present invention provides an asymmetrical alternate metal virtual ground (AAMG) EPROM array architecture that utilizes a cell structure having asymmetrically doped source and drain regions. The unintentional write problem associated with a neighboring cell during a write operation in the conventional AMG EPROM array is eliminated by utilizing a high select transistor bias and the asymmetrical cell. Soft write of the selected cell during read operations is minimized by biasing the source terminal. Thus, the bit line bias during a read operation can be significantly increased to enhance memory performance without creating a data retention problem.

A better understanding of the features and advantages of the present invention will be obtained by reference to the following detailed description of the invention and accompanying drawings which set forth an illustrative embodiment in which the principles of the invention are utilized.

DESCRIPTION OF THE DRAWINGS

FIGS. 4A and 4B are graphs illustrating unintentional write characteristics of the conventional AMG EPROM cell with various capacitors attached to its source.

FIGS. 5A and 5B are, respectively, a cross-sectional view and a simple schematic illustrating a known asymmetrical EPROM cell.

DETAILED DESCRIPTION OF THE INVENTION

Figure 1:
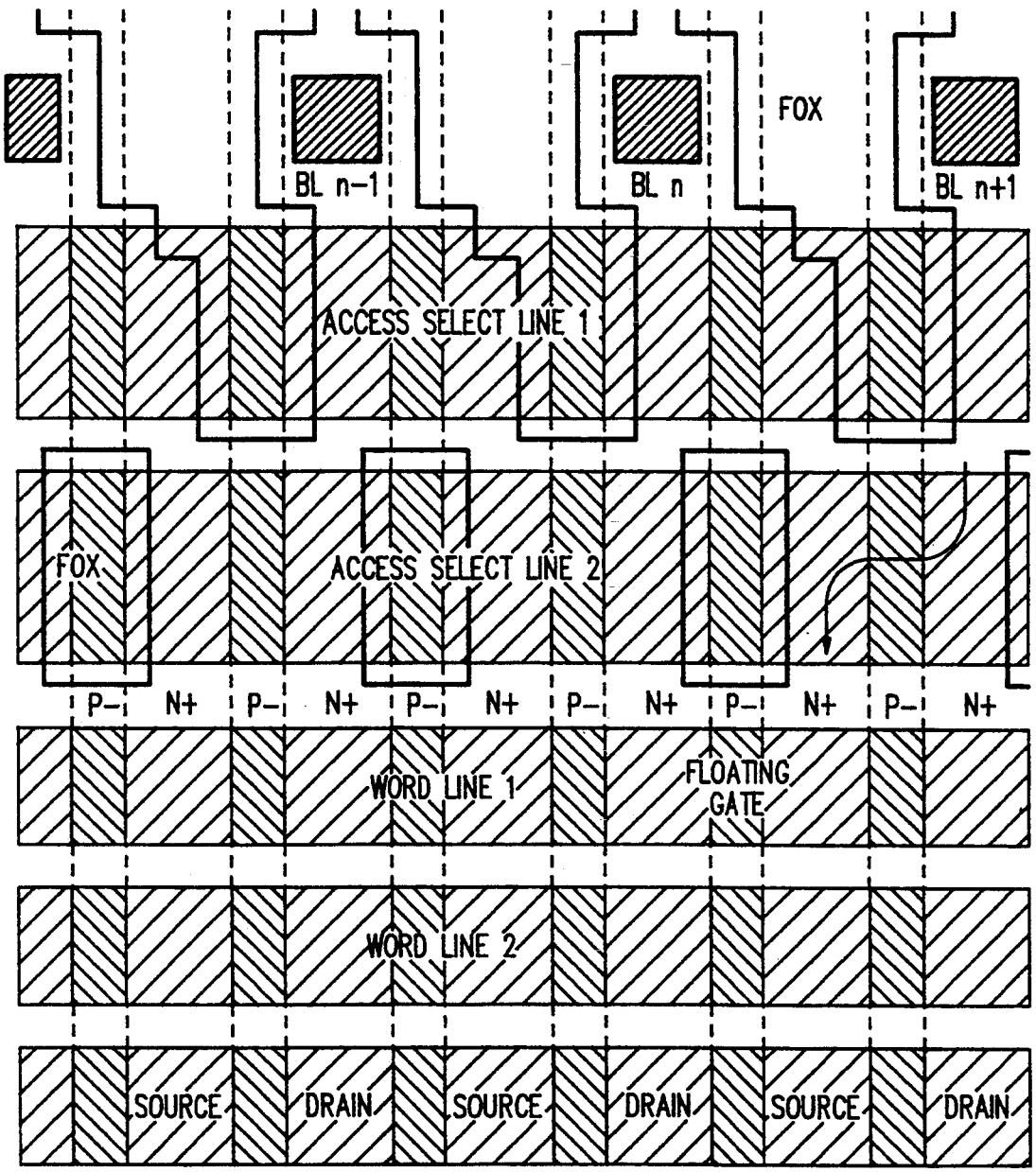
FIG. 1 is a layout illustrating a portion of a conventional AMG EPROM array.
Figures 2A, 2B:
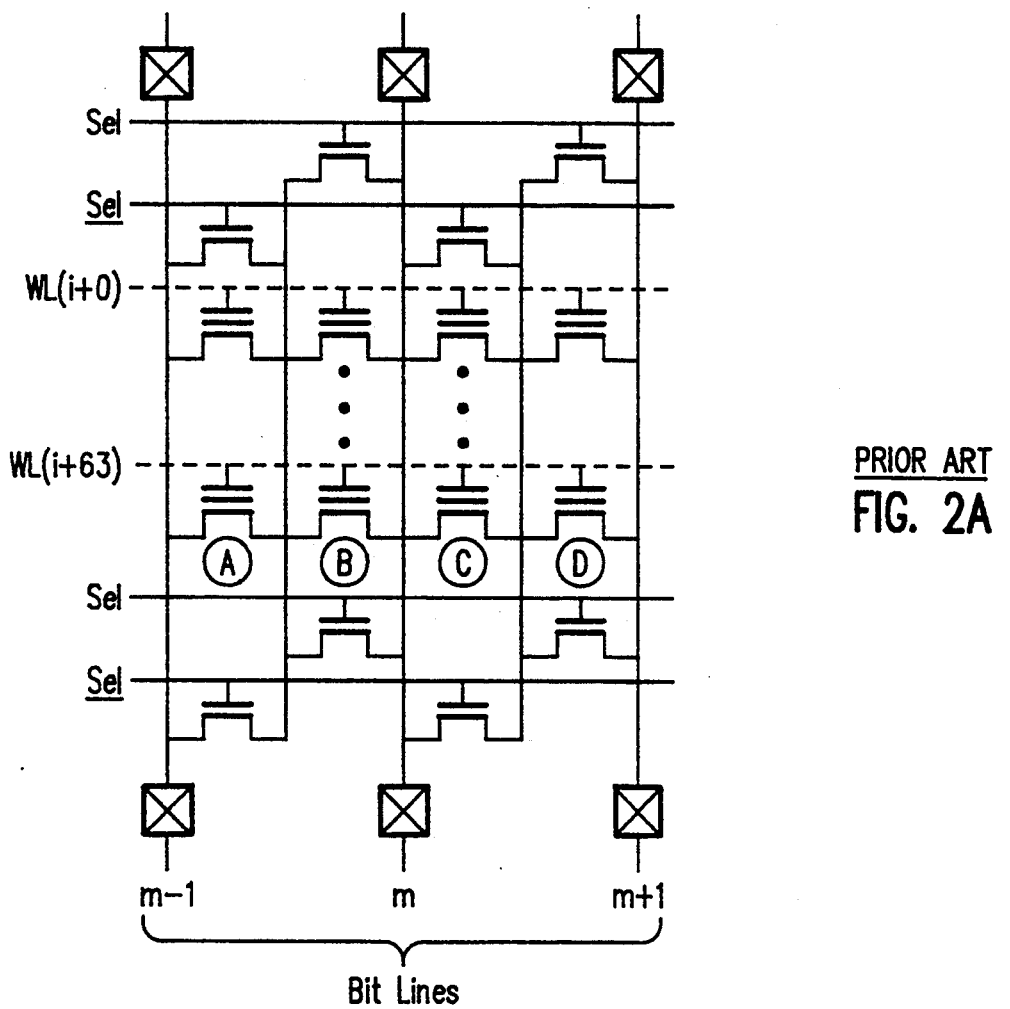
FIGS. 2A and 2B are a schematic diagram and a table illustrating an equivalent circuit for the FIG. 1 layout and the bias conditions for the operations of the circuit, respectively.
Figure 3:
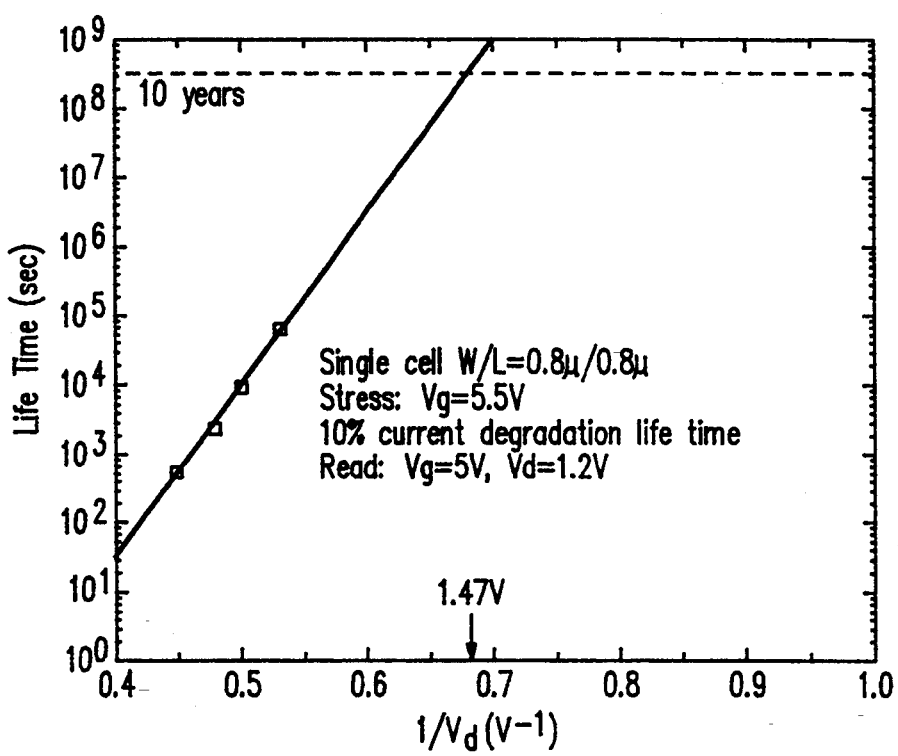
FIG. 3 is a graph illustrating the soft write characteristics of the conventional AMG EPROM cell.
Figure 4A:
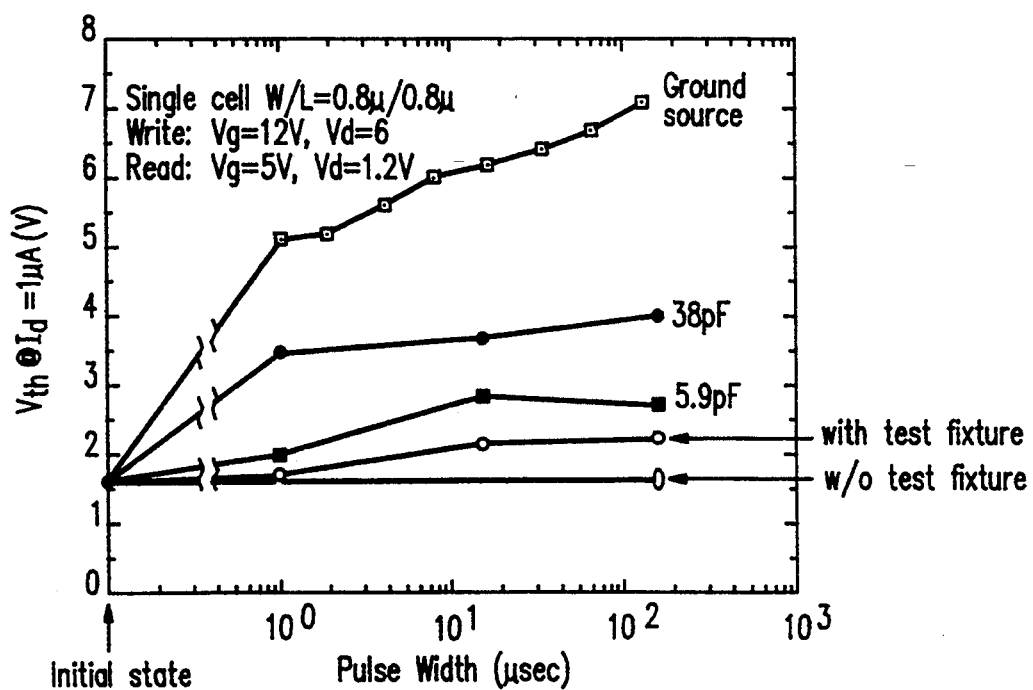
Figures 6A, 6B:
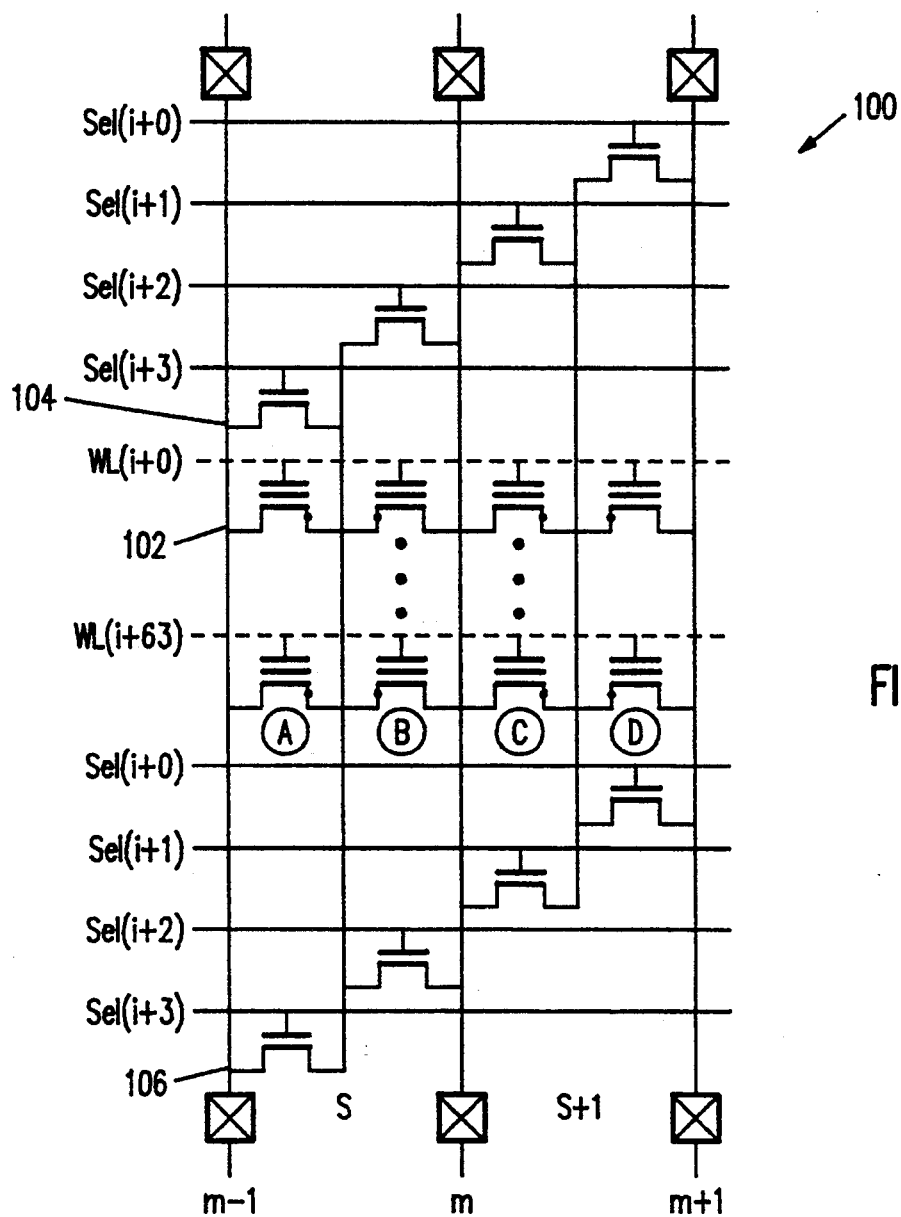
FIG. 6A and 6B are a schematic diagram and a table illustrating a portion of an asymmetrical alternate metal virtual ground (AAMG) EPROM array in accordance with the present invention and the bias conditions for various operations of the AAMG array, respectively.

FIG. 6A shows a portion 100 of an asymmetrical alternate metal virtual ground (AAMG) EPROM array in accordance with the present invention. Typically, the portion 100 is part of a larger array such as a 4 or 16 Megabit EPROM array.

The array portion 100 includes a plurality of floating gate storage cell transistors 102 arranged in a matrix of rows and columns. A typical floating gate cell transistor 102 consists of a source and drain region separated by a substrate channel. A floating gate overlies the channel but is insulated therefrom by a layer of dielectric material. Typically, the floating gate is formed from a first layer of polycrystalline silicon (poly1) and the dielectric material is silicon dioxide. Overlying the poly1 floating gate is an additional dielectric material, typically an oxide/nitride/oxide (ONO) sandwich, and a control gate formed from a second layer of polycrystalline silicon (poly2).

As further shown in FIG. 6A, each floating gate transistor 102 in a designated column of the array portion 100 has a pair of select transistors 104, 106 associated with it. For example, cell A in FIG. 6A is connected between drain bit line m−1 and source bit line s; select transistors 104 and 106 are also connected between bit lines m−1 and s. The gate of each select transistor is also connected to a corresponding select line Sel(i+n).

As further shown in FIG. 6A, every other N+ bit line is segmented. Thus, in FIG. 6A, bit lines s and s+1 are segmented into a length sufficient to form the source region for 64 floating gate transistors and, also, to be electrically connected to the select transistors. Bit lines m−1, m and m+1 are, however, not segmented. Thus, one pair of select transistors is capable of controlling 64 floating gate transistors 102. Although not shown in FIG. 6A, the four columns of cells 102 shown in array portion 100 are part of one 16-bit wide block of cells included in the larger EPROM array. As discussed in greater detail below, four rows of select transistors are formed on each side of an EPROM cell block to take advantage of cell asymmetry in read as well as write operations.

The bit lines are typically formed by implanting an N-type impurity (e.g. arsenic) into elongated strips in the P-type semiconductor substrate to form the conductive source and drain bit lines. In the FIG. 6 embodiment, the metal-contacted N+ bit lines m−1, m and m+1 are always drains while the non-contacted, segmented N+ bit lines s and s+1 are always sources.

In order to create an asymmetrical cell to minimize both unintentional write and soft write, in accordance with the present invention, an N⁻ implant and an N+ pull-back, are introduced at the source bit lines.

Figure 7:
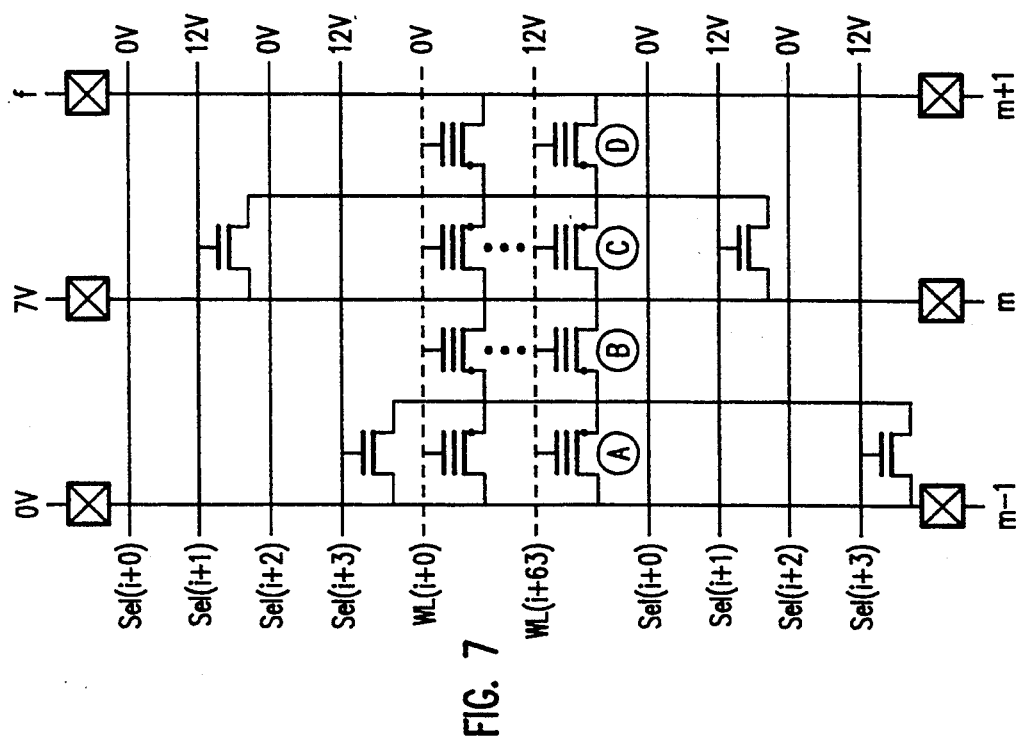
FIG. 7 is a schematic diagram illustrating bias conditions for an AAMG EPROM write operation.

FIG. 7 shows a schematic of the AAMG array write operation. As shown in FIG. 7, to write cell B, word line WL(i+63) select line Sel(i+1) and select line Sel-(i+3) are biased at 12 V. The other select lines are grounded. As far as bit line bias is concerned, bit lines m and m−1 are biased at 7 V and 0 V, respectively, while unselected bit lines are left to float. Since the select transistors are driven very hard, the strapped drain bit line m and the segmented source bit line are effectively shorted together to prevent cell C from being unintentionally written. Moreover, a low voltage drop across the select transistors enhances cell B programmability. Thus, bit line bias can be reduced to further minimize the unintentional write issue of both cell C and cell D. For cell D, since the high bit line bias is at the source terminal, i.e. where the N⁻ implant exists, unintentional write cannot occur.

Figure 8:
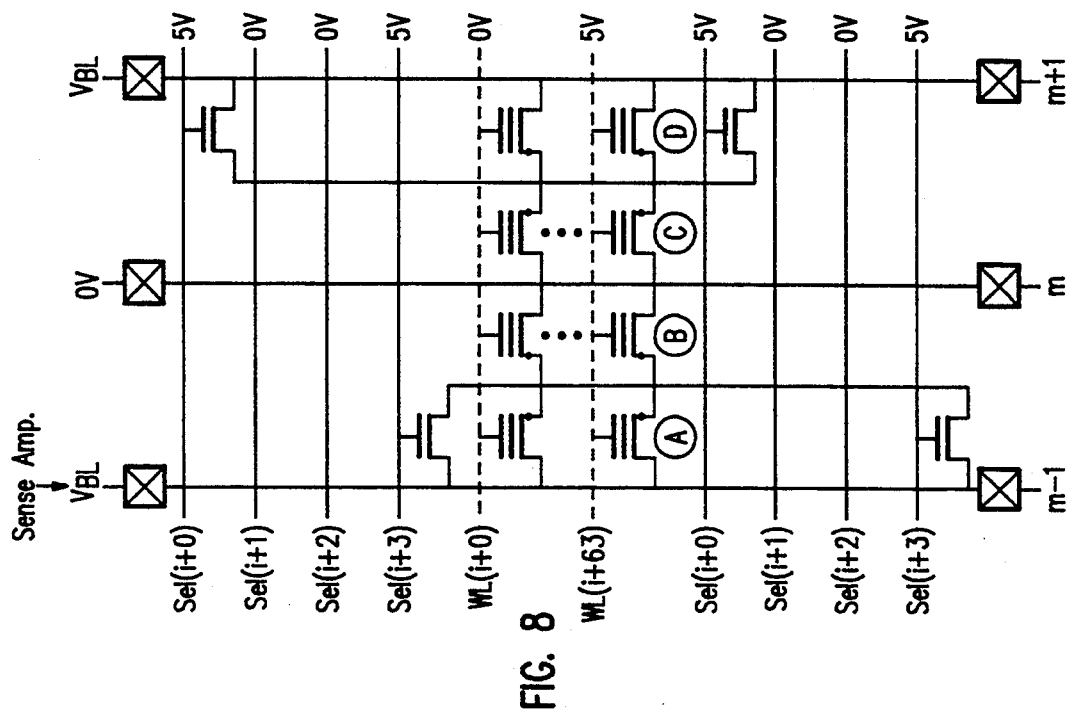
FIG. 8 is a schematic diagram illustrating bias conditions for an AAMG EPROM read operation.

FIG. 8 shows a schematic of the AAMG array read operation. As shown in FIG. 8, the array can be read from the source terminal to minimize soft write. To read cell B, word line WL(i+63), select line Sel (i+0) and select line Sel(i+3) are biased at 5 V while unselected word lines and unselected select lines are grounded. Bit line m is grounded while the other bit lines are biased at a bit line bias voltage $V_{BL}$ with the sense amplifier attached to bit line m−1. For both cell B and cell C, since the drain terminal (bit line m) is grounded while the bit line bias voltage $V_{BL}$ is applied at the source terminal, soft write can be minimized. Therefore, the bit line bias voltage $V_{BL}$ can be significantly increased to increase cell current and to enhance memory performance without posing a data retention concern.

Thus, based on this analysis, both the unintentional write and soft write problems associated with the conventional AMG EPROM array can be minimized by utilizing the asymmetrical cell approach described above, thus allowing high performance, high density EPROM arrays to be realized.

As shown in FIGS. 7 and 8, two select transistor connection patterns are needed to take advantage of cell asymmetry in both write and read operations. Thus, to implement the asymmetrical AMG array, four rows of select transistors are utilized on each side (top and bottom in FIG. 7 and 8) of a block of cells, resulting in only a minimal (less than 6%) increase in array size.

The AAMG EPROM array described above may be fabricated in a P-type silicon substrate according to the following process flow.

After processing the silicon substrate in accordance with conventional fabrication steps to form field oxide regions in the substrate, a layer of floating gate oxide about 200 Å thick is formed. Next, a first layer of polysilicon (poly1) is formed on the floating gate oxide and the poly 1 conductivity is adjusted to a desired level by the addition of an appropriate amount of dopant. A thin layer of silicon nitride about 150 Å thick is then deposited on the poly1 layer. This is followed by the formation of a thin polysilicon cap about 150 Å thick on the nitride layer.

Next, the thin poly/thin nitride/poly1 sandwich is etched to form parallel strips of thin poly/thin nitride/poly1 in both the cell array and select transistor portions. These strips will ultimately be further defined in a stacked etch step to provide the individual floating gates of the floating gate storage transistors of the cell array.

Formation of the thin poly/thin nitride/poly1 strips is followed by an N− blanket implant to form the lightly doped regions along the source bit lines. The source bit lines are then masked and a drain bit line N+ implant is performed. This mask is then removed and a TEOS layer (~1500 Å) is deposited and etched back to form a sidewall spacer. The spacer etch back stops on the thin poly and the silicon substrate for the floating poly lines and the bit lines, respectively. Next, an N+ blanket implant is performed, thereby an N− region and an N+ pull-back implant in the source bit lines result in the asymmetrical source/drain structure shown in FIG. 5A.

After the formation of the asymmetrical source/drain regions of the cell transistors, oxide about 800 Å thick is grown on all of the bit lines; this step also results in the oxidation of the thin poly cap on the thin poly/thin nitride/poly1 strips. The thin oxide and thin nitride are then removed from the underlying poly1 strips and a composite layer of oxide/nitride/oxide (ONO) about 250 Å thick is formed thereon.

A mask is then formed to protect the array and the ONO/poly1 is etched from the select transistor and peripheral portions of the substrate. The floating gate oxide is then etched from the select transistor and peripheral portions before a layer of gate oxide about 200 Å thick is grown.

After growing the gate oxide, a second layer of polysilicon (poly2) is deposited over the entire structure. A layer of tungsten silicide about 2500 Å thick is then formed on the poly2 by low pressure chemical vapor deposition (LPCVD). The poly2/silicide is then patterned and etched to define array word lines that run perpendicular to the ONO/poly1 strips.

Final definition of the cells is completed in a self-aligned stacked gate etch that removes ONO/poly from between the word lines.

Processing then continues in the conventional manner to define the remainder of the array and the periphery.

It should be understood that various alternatives to the embodiments of the invention described herein may be employed in practicing the invention. It is intended that the following claims define the scope of the invention and that integrated circuit structures within the scope of these claims and their equivalents be covered thereby.

What is claimed is:

1. A method of programming a selected EPROM cell in an asymmetrical alternate metal virtual ground (AAMG) EPROM array that includes a plurality of EPROM cells wherein the AAMG EPROM array includes a layer of first insulating material formed on the silicon substrate p-type conductivity, a plurality of spaced-apart, parallel strips of second insulating material and underlying first conductive material formed on the first insulating material, the first conductive material defining floating gates of the EPROM cells, a plurality of bit lines formed in the silicon substrate between the parallel strips of second insulating material and underlying first conductive material to define substrate channel regions therebetween, alternate bit lines having different dopant diffusion characteristics so as to define alternating source and drain bit lines such that each EPROM cell has asymmetrical source and drain regions and a plurality of spaced-apart parallel word lines of second conductive material formed perpendicular to the strips of second insulating material and underlying first conductive material such that the word lines are separated from the floating gates by the second insulating material, and wherein the drain bit lines are contacted by contact conductive material while non-contacted source bit lines are segmented into a length sufficient to form the source region for a preselected plurality of EPROM cells, and the source bit lines are connectable to ground via select transistors thereby defining the AAMG array, the programming method comprising:

maintaining the word line of the selected cell at a programming voltage level;

maintaining the select lines connected to the gates of the select transistors that are connected to the source bit line of the selected cell and to the drain bit line of the selected cell at the programming voltage while maintaining remaining select lines at ground; and maintaining the drain bit line and the source bit line of the selected cell at a high voltage and ground, respectively, while allowing remaining drain bit lines to float whereby electrons channel from said drain bit line to the floating gate of the selected cell;

and whereby the asymmetry of the cell and a high select line bias voltage eliminate the unintentional write issue at the neighboring cell.

2. A programming method as in claim 1 wherein the first insulating material comprises silicon dioxide, the first and second conductive materials comprise polysilicon and the second insulating material comprises a composite of oxide/nitride/oxide (ONO).

3. A method of reading a selected EPROM cell in an asymmetrical alternate metal virtual ground (AAMG) EPROM array that includes a plurality of EPROM cells wherein the AAMG EPROM array includes a layer of first insulating material formed on the silicon substrate p-type conductivity, a plurality of spaced-apart, parallel strips of second insulating material and underlying first conductive material formed on the first insulating material, the first conductive material defining floating gates of the EPROM cells, a plurality of bit lines formed in the silicon substrate between the parallel strips of second insulating material and underlying first conductive material to define substrate channel regions therebetween, alternate bit lines having different dopant diffusion characteristics so as to define alternating source and drain bit lines such that each EPROM cell has asymmetrical source and drain regions and a plurality of spaced-apart parallel word lines of second conductive material formed perpendicular to the strips of second insulating material and underlying first conductive material such that the word lines are separated from the floating gates by the second insulating material, and wherein the drain bit lines are contacted by contact conductive material while non-contacted source bit lines are segmented into a length sufficient to form the source region for a preselected plurality of EPROM cells, and the source bit lines are connectable to ground via select transistors thereby defining the AAMG array, the reading method comprising:

maintaining the word line of the selected cell at a programming voltage level;

maintaining the select lines connected to the gates of the select transistors that are connected to the source bit line of the selected cell and to the drain bit line of the selected cell at the programming voltage while maintaining remaining select lines at ground; and maintaining the drain bit line and the source bit line of the selected cell at a high voltage and ground, respectively, while allowing remaining drain bit lines to float whereby electrons channel from said drain bit line to the floating gate of the selected cell;

and whereby the asymmetry of the cell and a high select line bias voltage eliminate the unintentional write issue at the neighboring cell.

4. A reading method as in claim 2 wherein the first insulating material comprises silicon dioxide, the first and second conductive materials comprise polysilicon and the second insulating material comprises a composite of oxide/nitride/oxide (ONO).

* * * * *